(12) United States Patent
Vu

(10) Patent No.: US 6,281,730 B1
(45) Date of Patent: Aug. 28, 2001

(54) CONTROLLED SLEW RATE DRIVER

(75) Inventor: Ha Chu Vu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/388,862

(22) Filed: Sep. 2, 1999

Related U.S. Application Data (60) Provisional application No. 60/133,900, filed on May 13, 1999.

(51) Int. Cl.[7] ............................................... H03K 5/12
(52) U.S. Cl. ........................ 327/170; 327/108; 327/437; 330/288; 323/316
(58) Field of Search ....................... 327/108–112, 170, 327/436, 437; 330/288; 323/315, 316

(56) References Cited

U.S. PATENT DOCUMENTS

| | | | |
|---|---|---|---|
| 4,176,289 | 11/1979 | Leach et al. ............................. | 326/88 |
| 4,443,715 | 4/1984 | Fox ........................................ | 326/88 |
| 4,713,561 | 12/1987 | Yamada .................................. | 326/22 |
| 4,825,099 | * 4/1989 | Barton ................................... | 327/541 |
| 4,958,123 | * 9/1990 | Hughes .................................. | 323/316 |
| 5,124,632 | * 6/1992 | Greaves ................................. | 327/537 |
| 5,241,502 | 8/1993 | Lee et al. ................................ | 365/203 |
| 5,262,690 | 11/1993 | Cochran et al. ........................ | 327/264 |
| 5,266,847 | 11/1993 | Kuo ....................................... | 326/62 |
| 5,293,082 | 3/1994 | Bathaee ................................. | 327/108 |
| 5,452,333 | 9/1995 | Guo et al. .............................. | 375/371 |
| 5,467,464 | 11/1995 | Oprescu et al. ....................... | 713/400 |
| 5,469,096 | * 11/1995 | Nessi et al. ........................... | 327/108 |
| 5,489,861 | 2/1996 | Seymour ............................... | 327/108 |
| 5,491,436 | * 2/1996 | Austin ................................... | 327/108 |
| 5,525,927 | * 6/1996 | Yung et al. ........................... | 323/316 |
| 5,539,341 | 7/1996 | Kuo ...................................... | 327/108 |
| 5,557,223 | 9/1996 | Kuo ...................................... | 327/108 |
| 5,587,678 | 12/1996 | Dijkmans ............................. | 327/108 |
| 5,654,981 | * 8/1997 | Mahant-Shetti et al. ............. | 327/108 |
| 5,825,218 | * 10/1998 | Colli et al. ........................... | 327/112 |
| 5,835,994 | * 11/1998 | Adams ................................. | 323/315 |
| 5,883,531 | 3/1999 | Kuo ...................................... | 327/108 |

* cited by examiner

Primary Examiner—Kenneth B. Wells
(74) Attorney, Agent, or Firm—Stallman & Pollock LLP

(57) ABSTRACT

A driver circuit in accordance with the present invention combines current controlled current source and sink circuits, which are independent of process, temperature, and supply voltage, and voltage controlled current source and sink circuits to control the slew rate at the output of the driver circuit and thereby reduce switching noise. The driver includes an output transistor coupled to an output node, a current source, a current mirror transistor having a control node connected to the control node of the output transistor and a conduction path coupled to the current source, and a voltage controlled switch coupled between the conduction path of the current mirror transistor and the control node of the output transistor. The voltage controlled switch is coupled to the output node and is open when the output node is within a first voltage range, and is closed when the output node is within a second voltage range.

22 Claims, 4 Drawing Sheets

| b1 | b0 | A | B | C |
|----|----|---|---|---|
| 0  | 0  | 0 | 0 | 0 |
| 0  | 1  | 1 | 0 | 0 |
| 1  | 0  | 1 | 1 | 0 |
| 1  | 1  | 1 | 1 | 1 |

CONTROLLED SLEW RATE DRIVER

RELATED APPLICATIONS

This application claims the benefit of and incorporates herein by reference U.S. provisional patent application no. 60/133,900, filed May 13, 1999, and entitled "Controlled Slew Rate Driver."

BACKGROUND OF THE INVENTION

1. Field of the Invention

The present invention relates to driver circuits, and in particular, to a digital driver circuit that provides a controlled slew rate at the output of the circuit.

2. Description of the Related Art

Driver circuits are used for communicating digital information between different portions of electronic systems. For example, in mixed signal systems that have both analog and digital circuits, information in the form of analog signals may be received by one section of an electronic system and converted into digital information. Once converted into digital form, the information may be communicated across the system to a microprocessor, microcontroller, or digital signal processor. Driving digital data between the different portions of an electronic system presents many design challenges. First, digital signal lines between devices in an electronic system usually have large capacitances and parasitic inductances associated with them. Large CMOS devices utilizing large current values are typically used to drive the large capacitive loads at high speeds. However, at high switching frequencies, the large currents through the parasitic inductances cause large voltage spikes that can exceed noise margin requirements. This switching noise becomes even more of a problem when the noise couples into the analog portions of a mixed signal integrated circuit.

Another challenge associated with designing digital drivers is to maintain a constant output current across variations in process, temperature, and supply voltage. The output current of a typical CMOS driver will vary with process, temperature, and supply voltage. In order to guarantee the desired operation at nominal values, typical drivers are designed to output a nominal current which is greater than the minimum required under normal conditions. However, in a fast process, this current can become several times more than the minimum required. This large current can result in high voltage slew rates which can inject noise into the analog portions of the mixed signal system.

Accordingly, it would be desirable to have a digital driver circuit with a controlled current output, or slew rate, to reduce the switching noise in the mixed signal system. Additionally, it would be desirable to have a digital driver that maintains a constant current output across process, temperature, and supply variations.

SUMMARY OF THE INVENTION

A driver circuit in accordance with the present invention combines current controlled current source and sink circuits, which are independent of process, temperature, and supply voltage, and voltage controlled current source and sink circuits to control the slew rate at the output of the driver circuit and thereby reduce switching noise. The driver includes an output transistor coupled to an output node, a current source, a current mirror transistor having a control node connected to the control node of the output transistor and a conduction path coupled to the current source, and a voltage controlled switch coupled between the conduction path of the current mirror transistor and the control node of the output transistor. The voltage controlled switch is coupled to the output node and is open when the output node is within a first voltage range, and is closed when the output node is within a second voltage range.

In accordance with another embodiment of the present invention, a first input transistor has a control node coupled to receive a circuit input and a conduction path coupled in series between the current source and the control node of the output transistor. In accordance with another embodiment of the present invention, a second input transistor of complementary device type to the first input transistor has a control node coupled to receive the circuit input and a conduction path coupled both the conduction path of the first input transistor and to the control node of the output transistor.

In accordance with another embodiment of the present invention, a controlled slew rate driver includes timing and control logic for receiving input signals, a high side driver stage for charging a capacitive output node, and a low side driver stage for discharging a capacitive output node. The high side driver and the low side driver are substantially similar and are comprised of complementary device types.

In accordance with another embodiment of the present invention, selectable current source is coupled to the current source in the driver circuit for digitally controlling the output slew rate of the controlled slew rate driver. The selectable current source includes a current mirror array in which current gate transistors are selectively activated to increase the amount of current supplied at the output of the selectable current source. In one embodiment the current gate transistors are controlled by digital outputs of a digital logic circuit.

These and other features and advantages of the present invention will be understood upon consideration of the following detailed description of the invention and the accompanying drawings.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE INVENTION

Figure 1:
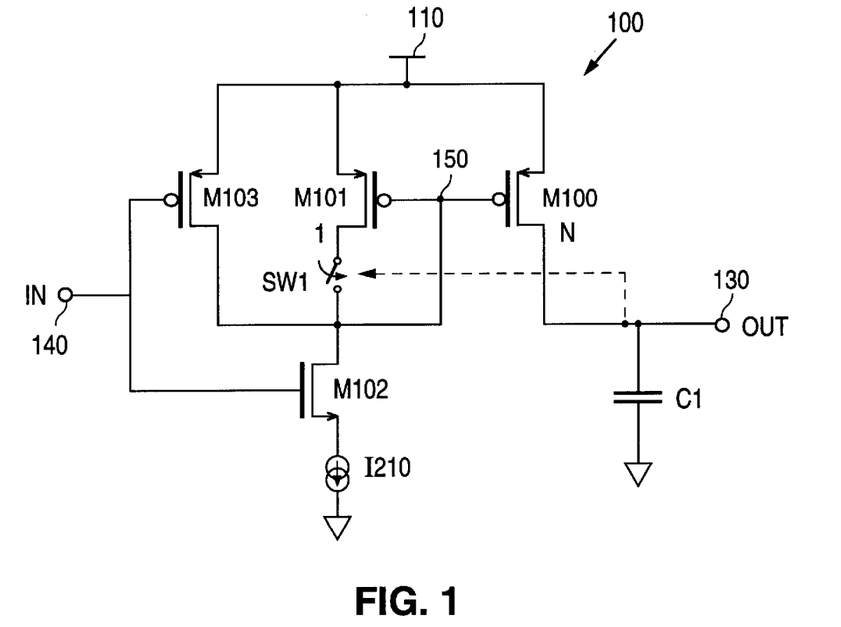
FIG. 1 is a schematic diagram of a driver circuit in accordance with one embodiment of the present invention.

Referring to FIG. 1, a controlled slew rate driver 100 in accordance with one embodiment of the present invention includes an output node 130 having an associated capacitance C1 to ground. Output node 130 can be associated with digital signal lines between devices in an electronic system, for example. Driver 100 includes output transistor M100. Output transistor M100 of FIG. 1 is a PMOS transistor having a gate control node and a conduction path between a source and a drain. The drain of output transistor M100 is connected to output node 130. The source of output transistor M100 is connected to supply voltage source 110, which provides a supply voltage for driver circuit 100. Driver 100 also includes a current mirror transistor M101 which has a gate control node connected to the gate control node of output transistor M100 at 150. Current mirror transistor M101 of FIG. 1 is also a PMOS transistor which has a conduction path between a source and a drain. The source of current mirror transistor M101 is connected to voltage source 110 and to the source of output transistor M100. The drain of current mirror transistor M101 is connected in series with a voltage controlled switch SW1 which is controlled by the output voltage 130, an input transistor M102, and a slew control current source I120. Slew control current source I120 sinks a constant current across process, temperature, and supply voltage. Design of such current sources are well known to those skilled in the art. Slew control current source I120 is connected to the common control node 150 through the source to drain conduction path of input transistor M102. Slew control current source I120 is also connected to the drain of current mirror transistor M101 through voltage controlled switch SW1. Input transistor M102 of FIG. 1 is a NMOS transistor which has a gate control node connected for receiving input signals from input node 140. Input signals applied to input node 140 are also received by a second input transistor M103 which is of complementary device type to input transistor M102. Input transistor M103 of FIG. 1 is a PMOS transistor with its source connected to voltage source 110 and its drain connected to the drain of M102, control node 150, and voltage controlled switch SW1.

In accordance with well known CMOS transistor principles, when the input node 140 transitions from a low voltage, such as ground, to a high voltage, such as the supply, input transistor M102 will turn on. Voltage controlled switch SW1 is designed such that it will be closed when the output node 130 is near ground, and will open when the output node is near the supply. Design of such a switch is well known to those skilled in the art. Therefore, initially SW1 is closed and transistors M100 and M101 are configured as a current controlled current source, or current mirror. The current from slew control current source I120 will flow through input transistor M102 and be mirrored through current mirror M101 and M100. The widths of transistors M101 and M100 can be ratioed according to well known principles such that the current through M100 is larger than I120. For example, the ratio of M101 to M100 of FIG. 1 is 1:N. Therefore, assuming C1 is initially discharged, a constant current equal to N×I120 will begin to charge capacitance C1 on output node 130. The resulting slew rate will be linear and controlled by current source I120 in accordance with well known principles. When the output node 130 reaches a predetermined voltage near the supply, SW1 will open. The current through output transistor M100 will then be controlled by the gate-to-source voltage of M100 that is set up between the supply potential and the drain of input transistor M102. This voltage will control the output current for the remaining portion of the output node transition. Because the switch SW1 will only open when the output node 130 is near the supply, the majority of the voltage transition on output node 130 will be current controlled, and only a small portion of the transition will be voltage controlled. In this manner, the output slew rate can be controlled, thereby reducing transient noise. Additionally, because current source I120 can be designed to be independent of process, temperature, and supply voltage, the output current can be kept to the minimum required to meet system specifications.

Controlled slew rate driver 100 of FIG. 1 also includes PMOS transistor M103. When the input at node 140 transitions from high to low, input transistor M102 turns off and M103 turns on. This causes common control node 150 to be pulled up to the supply potential 110, thereby turning off output transistor M100.

Figure 2:
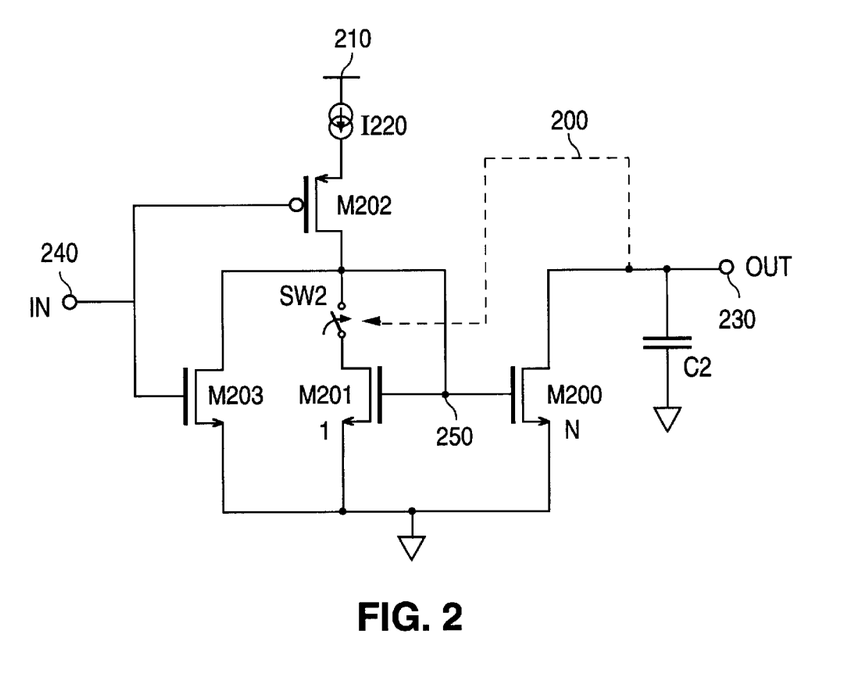
FIG. 2 is a schematic diagram of a driver circuit in accordance with another embodiment of the present invention.

Referring to FIG. 2, a controlled slew rate driver 200 in accordance with another embodiment of the present invention operates in a complementary manner to controlled slew rate driver 100. Controlled slew rate driver 200 includes an output transistor M200, a mirror transistor M201, a slew control current source I120, a voltage controlled switch SW2, and complementary input transistors M202 and M203, connected substantially as shown in FIG. 2. When the input node 240 transitions from a high voltage, such as the supply potential, to a low voltage, such as ground, input transistor M202 will turn on. Voltage controlled switch SW2 is designed such that it will be closed when the output node 230 is near the supply, and will open when the output node approaches ground. Therefore, initially SW2 is closed and M200 and M201 are configured as a current controlled current source, or current mirror. The current from slew control current source I220 will flow through input transistor M202 and be mirrored through current mirror M201 and M200. As with driver 100 of FIG. 1, the widths of transistors M201 and M200 can be ratioed such that the current through M200 is larger than I220. For example, the ratio of M201 to M200 of FIG. 1 is 1:N. Therefore, assuming C2 is initially charged, a constant current equal to N×I120 will begin to discharge capacitance C2 on output node 230. The resulting slew rate will be linear and controlled by current source I220. When the output node 230 reaches a predetermined voltage near ground, SW2 will open. The current through output transistor M200 will then be controlled by the gate-to-source voltage of M200 that is set up between the drain of input transistor M202 and ground. This voltage will control the output current for the remaining portion of the output node transition. Furthermore, when the input at node 240 transitions from low to high, input transistor M202 turns off and complementary input transistor M203 turns on. This causes common control node 250 to be pulled down to ground, thereby turning off output transistor M200.

Figure 3:
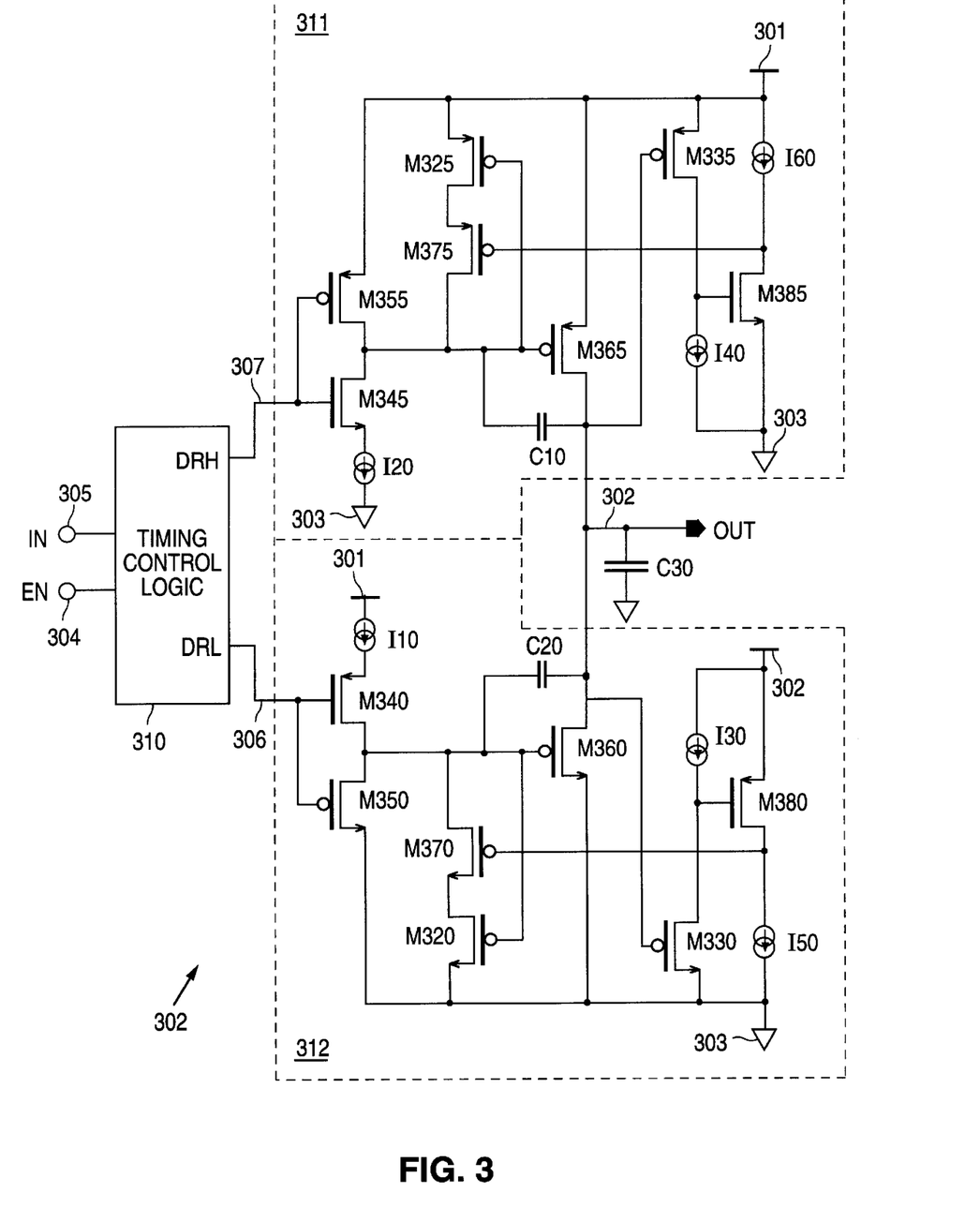
FIG. 3 is a schematic diagram of a driver circuit in accordance with still another embodiment of the present invention.

Referring to FIG. 3, a controlled slew rate driver 300 according to another embodiment of the present invention includes timing and control logic 310, a high side driver stage 311 for sourcing current, and a low side driver stage 312 for sinking current. The controlled slew rate driver circuit of FIG. 3 can be utilized to charge and discharge a capacitance C30 on a signal line 302.

Digital input signals to be driven between devices in an electronic system are applied to node IN 305. Additionally, the system can provide an enable signal EN at node 304 for selectively disabling the driver. As described in more detail below, timing and control logic 310 receives the digital signals to be communicated and transmits signals drive high DRH on line 307 and drive low DRL on line 306. Signals DRH and DRL are timed according to whether the transition is from high to low or from low to high. If the transition is from high to low, timing and control logic 310 first transitions DRH from high to low, thereby turning off high side driver stage 311. Then, after a predetermined delay, timing and control logic 310 transitions DRL from high to low, thereby activating low side driver stage 312 which discharges capacitive load C30. Analogously, if the transition is from low to high, timing and control logic 310 first transitions DRL from low to high, thereby turning off low side driver stage 312. DRH is then transitioned from low to high after another predetermined delay, thereby activating high side driver stage 311 which will charge capacitive load C30.

High side driver 311 in FIG. 3 includes output transistor M365, mirror transistor M325, slew control current source I20, output feedback capacitor C10, and complementary input devices M345 and M355 connected substantially as shown. Additionally, high side driver 311 includes one embodiment of a voltage controlled switch which includes switch transistor M375, first common source transistor M335, second common source transistor M385, and current sources I40 and I60. When the output is low, the voltage controlled switch is turned on by feeding back the output voltage to the control gate of switch transistor M375. In the embodiment shown in FIG. 3 the output voltage is connected to the input of a common source connected PMOS transistor M335. The drain of M335 is connected to current source I40 and to the control gate of a common source connected NMOS transistor M385. The drain of M385 is connected to current source I60 and to the gate of switch transistor M375. When the output is low, M335 is on, thereby pulling the gate of M385 to the supply. This will turn M385 on, thereby pulling the gate of switch transistor M375 to ground. When the voltage at the output node 302 rises to within a threshold voltage of the supply, M335 will turn off. Current source I40 will turn off M385 by pulling its gate to ground. When M385 is off, current source I60 will turn off switch transistor M375 by charging its gate up above its threshold voltage. As a result, when the output transitions from low to high, the switch transistor M375 is initially on. When the output rises to within a threshold of the supply, the output voltage is fed back to turn switch transistor M375 off.

Low side driver 312 in FIG. 3 includes output transistor M360, mirror transistor M320, slew control current source I10, output feedback capacitor C20, and complementary input devices M340 and M350 connected substantially as shown. Additionally, low side driver 312 includes one embodiment of a voltage controlled switch which includes switch transistor M370, first common source transistor M330, second common source transistor M380, and current sources I30 and I50. When the output is high, the voltage controlled switch is turned on by feeding back the output voltage to the control gate of switch transistor M370. In the embodiment shown in FIG. 3 the output voltage is connected to the input of a common source connected NMOS transistor M330. The drain of M330 is connected to current source I30 and to the control gate of a common source connected PMOS transistor M380. The drain of M380 is connected to current source I50 and to the gate of switch transistor M370. When the output is high, M330 is on, thereby pulling the gate of M380 to the ground. This will turn M380 on, thereby pulling the gate of switch transistor M370 to the supply. When the voltage at the output node 302 discharges to within a threshold voltage of ground, M330 will turn off. Current source I30 will turn off M380 by charging its gate to the supply voltage. When M380 is off, current source I50 will turn off switch transistor M370 by discharging the gate below the threshold voltage. As a result, when the output transitions from high to low, the switch transistor M370 is initially on. When the output discharges to within a threshold of ground, the output voltage is fed back to turn switch transistor M370 off.

Controlled slew rate driver 300 operates in accordance with well known CMOS transistor principles. High side driver 311 operates in a substantially similar manner as the controlled slew rate driver circuit 100 of FIG. 1. However, high side driver 311 includes the additional devices for implementing the voltage controlled switch SW1 of FIG. 1, as described above, and includes an output feedback capacitor C10. Low side driver 312 operates in a substantially similar manner as the controlled slew rate driver 200 circuit of FIG. 2. However, low side driver 312 includes the additional devices for implementing the voltage controlled switch SW2 of FIG. 2, as described above, and includes an output feedback capacitor C20. Together, timing and control logic 310, high side driver 311, and low side driver 312 drive digital signals received at the input IN 305 onto the output node 302 in the following manner.

By way of example, the controlled slew rate driver 300 may first receive an input transition from low to high. Timing and control logic 310 first transitions DRL low to high, thereby turning off low side driver 312, and then transitions DRH low to high after a predetermined delay. Initially, the output is discharged to a voltage near ground. Switch transistor M375 is therefore initially turned on, and the current in source I20 is mirrored through mirror transistor M325 and output transistor M365 to charge the capacitance C30 at output node 302. The current through M365 can be increased according to a ratio as previously described. Output feedback capacitor C10 is connected between the output 302 and the gate control node of output transistor M365 to provide stability according to well understood principles. The mirrored current from I20 will continue to charge the output node 302 at a controlled slew rate until the output approaches to within a threshold voltage of the supply. When the output voltage is less than a threshold voltage below the supply M375 is turned off and the gate of output transistor M365 is pulled low as the voltage at the drain of M345 is pulled toward ground by slew control current source I20. The output will continue to charge to the supply as output transistor M365 continues to provide a current that is controlled by its gate to source voltage and drain to source voltage.

The controlled slew rate driver 300 then receives an input transition from high to low. Timing and control logic 310 first transitions DRH high to low, thereby turning off high side driver 311, and then transitions DRL high to low after a predetermined delay. Initially, the output is charged to the supply voltage. Switch transistor M370 is therefore initially turned on, and the current in source I10 is mirrored through mirror transistor M320 and output transistor M360 to discharge the capacitance C30 at output node 302. The current through M360 can be increased according to a ratio as previously described. Output feedback capacitor C20 is connected between the output 302 and the gate control node of output transistor M360 to provide stability according to well understood principles. The mirrored current from I10 will continue to discharge the output node 302 at a controlled slew rate until the output approaches to within a threshold voltage of ground. When the output voltage is less than a threshold voltage above ground, M370 is turned off and the gate of output transistor M360 is pulled high as the voltage at the drain of M340 is charged toward the supply by current source I10. The output will continue to discharge to ground as output transistor M360 continues to sink a current to ground that is controlled by its gate to source voltage and its drain to source voltage.

Figure 4:
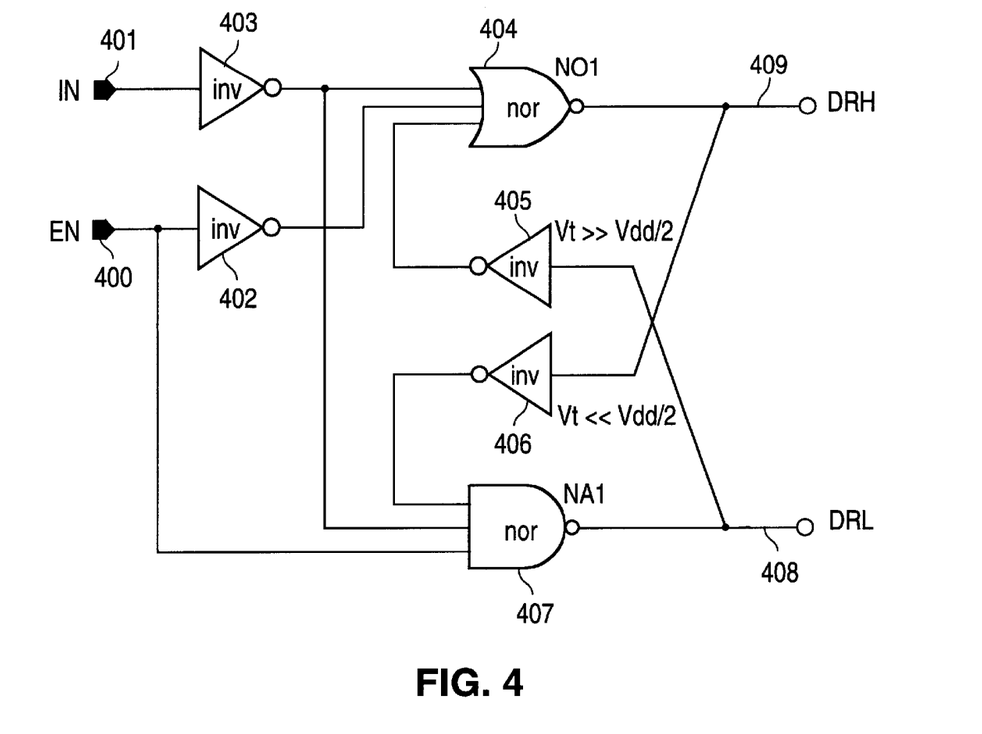
FIG. 4 is a schematic diagram of the logic circuits of the timing control logic.
Figure 5:
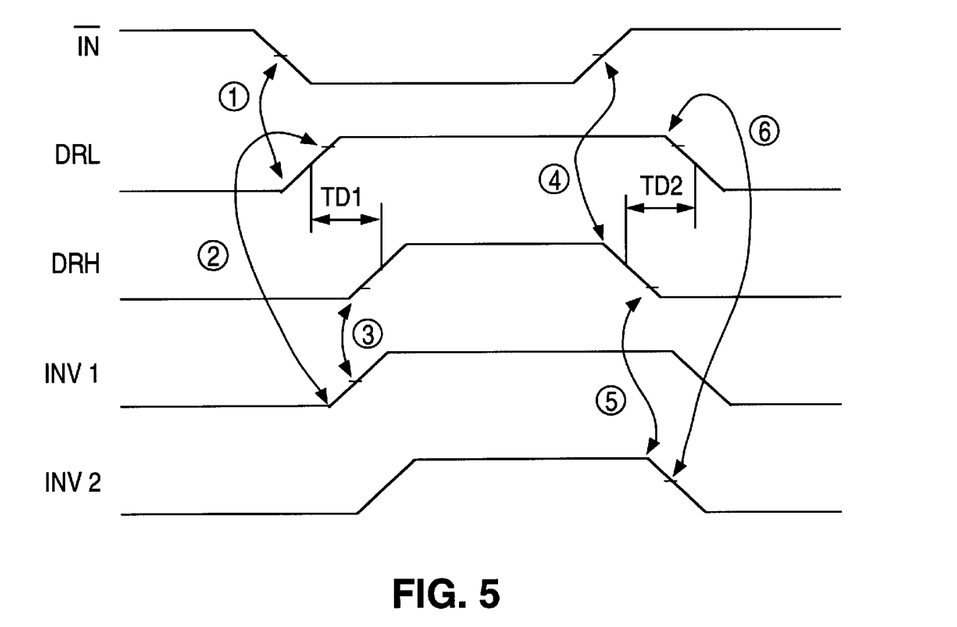
FIG. 5 is a timing diagram corresponding to the logic circuit of FIG. 4.

Referring to FIG. 4, timing and control logic 400 in accordance with one embodiment of the present invention includes a first input inverter 403, a NOR gate 404, a NAND gate 407, a first feedback inverter 405, a second feedback inverter 406, and an enable input inverter 402 connected substantially as shown in FIG. 4. FIG. 5 is a logic timing diagram that illustrates the transitions of the output of inverter 403 IN*, the output of NOR gate 404 on line DRH 409, the output of NAND gate 407 on line DRL 408, the output of the first feedback inverter INV1 405, and the output of the second feedback inverter INV2 406. Digital input signals are received at node 401, inverted by the first input inverter 403, and transmitted to both NAND gate 407 and NOR gate 404.

Assuming the input is initially low and the enable line 400 is high, a low to high transition at the input will produce a high to low transition at the output of inverter 403. This transition will cause NAND gate 407 to change state and DRL will transition from low to high as shown at (1) in FIG. 5. Feedback inverter 405 is designed with a threshold much greater than half the supply voltage of the inverter (Vt>>Vdd/2). Designing an inverter with such a characteristic is well known by those skilled in the art. A typical value for the transition point may be .8Vdd or 80% of the supply. Therefore, inverter 405 will not transition until DRL has reached 80% of the supply voltage as shown at (2) in FIG. 5. The result of setting the threshold above half the supply voltage will be to increase the time delay TD1 between the transition of DRL and the transition of DRH. DRH will transition from low to high only after the signal has propagated through the first feedback inverter 405. This delay TD1 is used to turn off low side driver 312 before turning on high side driver 311 as previously discussed.

As a further example, assuming the input is initially high and the enable line 400 is high, a high to low transition at the input will produce a low to high transition at the output of inverter 403. This transition will cause NOR gate 404 to change state and DRH will transition from low to high as shown at (4) in FIG. 5. Feedback inverter 406 is designed with a threshold much less than half the supply voltage of the inverter (Vt<<Vdd/2). Designing an inverter with such a characteristic is well known by those skilled in the art. A typical value for the transition point may be .2Vdd or 20% of the supply. Therefore, inverter 406 will not transition until DRH has dropped to 20% of the supply voltage as shown at (5) in FIG. 5. The result of setting the threshold below half the supply voltage will be to increase the time delay TD2 between the transition of DRH and the transition of DRL. DRL will transition from high to low only after the signal has propagated through the second feedback inverter 406. This delay TD2 is used to turn off high side driver 311 before turning on low side driver 312 as previously discussed.

Figure 6:
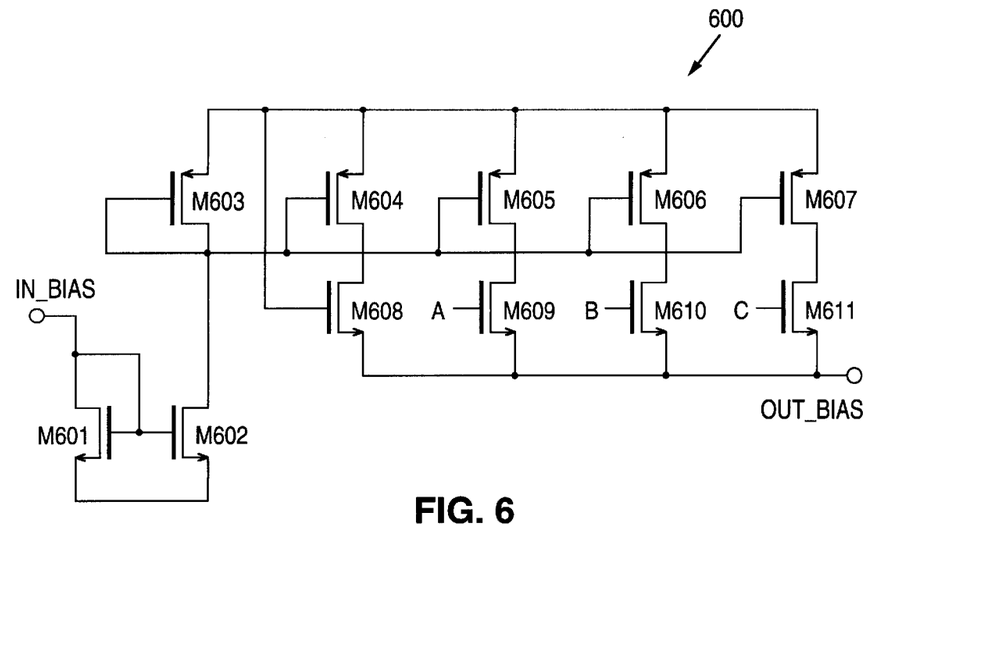
FIG. 6 is schematic diagram of a selectable bias control circuit.

Referring to FIG. 6, a selectable bias control circuit 600 according to one embodiment of the present invention is shown. The selectable bias control circuit provides for digital control of the output slew rate of a controlled slew rate driver of the present invention. This is achieved by digitally controlling the amount of current in the slew control current sources of the driver circuit. Selectable bias control circuit includes a bias current input IN_BIAS for receiving a constant process, temperature, and supply independent current, a first current mirror consisting of NMOS mirror devices M601 and M602, a current mirror array consisting of PMOS transistors M603, M604, M605, M606, and M607, and a bias current output control circuit consisting of NMOS current gate transistors M608, M609, M610, and M611. The bias current input at IN_BIAS is mirrored into the current mirror array by the action of M601 and M602. PMOS transistors M603, M604, M605, M606, and M607 will mirror the current to the drains of current gate devices M608, M609, M610, and M611. However, the state of digital inputs A, B, and C at the gates of M609, M610, and M611 will determine the amount of current transmitted at selectable bias control current output OUT_BIAS. Because the gate of M608 is connected to the supply, the minimum value of output current will be provided by M608 with A, B, and C at logic "0". The value of the current can be increased by turning on each device. OUT_BIAS can then be coupled to a slew control current source in the driver. As the value of OUT_BIAS is increased, the value of the slew control current source current will also increase. Therefore, during the current controlled current source portion of a transition, the slew rate at the output of the controlled slew rate driver will also increase.

Figure 7:
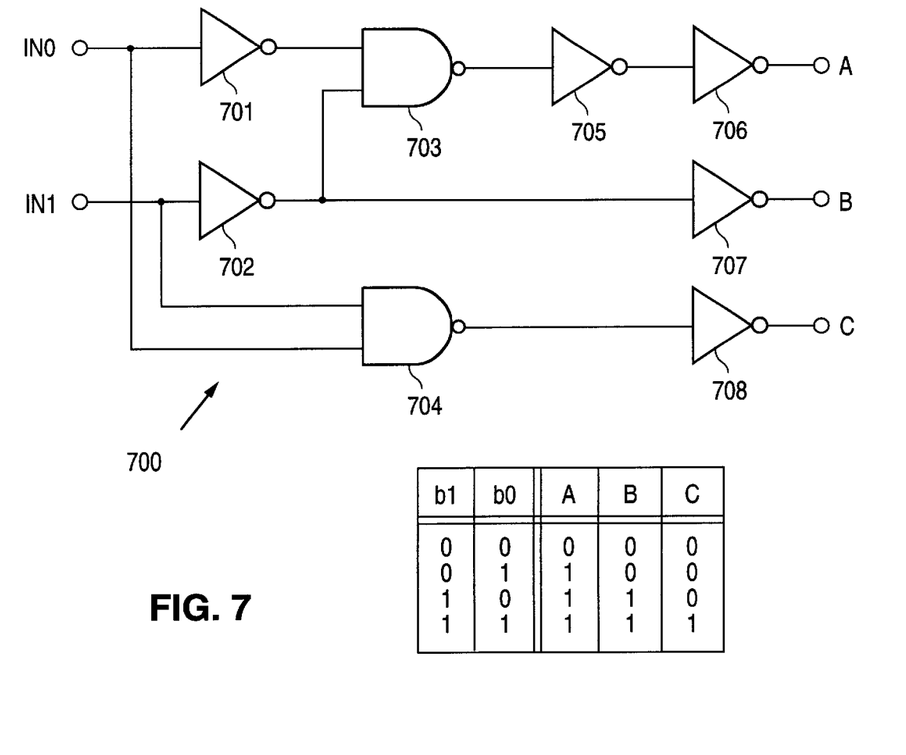
FIG. 7 is a schematic diagram of a current select circuit for controlling the selectable bias control circuit and its associated logic table.

Referring to FIG. 7, a current select circuit 700 according to one embodiment of the present invention is disclosed. Current select circuit 700 includes digital select inputs IN0 and IN1, inverter 701, inverter 702, NAND gate 703, NAND gate 704, inverter 705, and output inverters 706, 707, and 708. FIG. 7 also shows the logic truth table for the current select circuit 700.

Thus, a controlled slew rate driver has been described which includes current controlled current source and sink circuits and voltage controlled current source and sink circuits to control the slew rate at the output of the driver.

In the foregoing specification, the invention has been described with reference to specific exemplary embodiments thereof. It will, however, be evident that various modifications and changes can be made thereto without departing from the broader spirit and scope of the invention as set forth in the appended claims. The specification and drawings are, accordingly, to be regarded in an illustrative rather than restrictive sense.

What is claimed is:

1. An apparatus for providing an output signal with a controlled slew rate comprising:

a signal node having an associated node capacitance and configured to alternately receive first and second output signal currents and in accordance therewith convey an output signal voltage;

alternately active first and second complementary node driver circuits coupled to the signal node, each configured to receive said output signal voltage and corresponding first and second input signals, and in accordance therewith, to alternately provide said first and second output signal currents, the first and second node drivers alternately sourcing and sinking first and second output signal currents, wherein the first output signal current has a first constant value when said output signal voltage is within a first predetermined voltage range, and a first non-constant value when said output signal voltage is outside the first predetermined voltage range, and wherein the second output signal current has a second constant value when said output signal voltage is within a second predetermined voltage range, and a second non-constant value when said output signal voltage is outside the second predetermined voltage range;

first and second current conveying circuits coupled to the first and second node driver circuits to provide constant input currents as said first and second input signals to the node driver circuit when the output signal voltage is within the first and second predetermined voltage ranges; and first and second buffer circuits coupled to the first and second node driver circuits, the first and second buffer circuit being configured to receive first and second digital input signals having first and second digital states, wherein
when the first and second digital input signals are in said first digital state the first buffer circuit couples first said current conveying circuit to the first node driver circuit and the second buffer circuit couples a first bias voltage to the second node driver circuit to deactivate the second node driver, and
when the first and second digital input signals are in said second digital state the second buffer circuit couples said second current conveying circuit to the second node driver circuit and the first buffer couples a second bias voltage to the first node driver circuit to deactivate the first node driver circuit.

2. The apparatus of claim 1, further comprising timing and control logic for receiving a digital data signal having first and second digital states and transmitting said first and second digital input signals and wherein:
when the digital data signal transitions from said first digital state to said second digital state the timing and control logic asserts said first digital input signal to said first buffer, and after a predetermined delay, asserts said second digital input signal to said second buffer; and
when the digital data signal transitions from said second digital state to said first digital state the timing and control logic asserts said second digital input signal to said second buffer, and after a predetermined delay, asserts said first digital input signal to said first buffer.

3. An apparatus for providing an output signal with a controlled slew rate comprising:
a signal node having an associated node capacitance and configured to alternately receive first and second output signal currents and in accordance therewith convey an output signal voltage; and
alternately active first and second complementary node driver circuits coupled to the signal node, each configured to receive said output signal voltage and corresponding first and a second input signals, and in accordance therewith, to alternately provide said first and second output signal currents, the first and second node drivers alternately sourcing and sinking first and second output signal currents,
wherein the first output signal current has a first constant value when said output signal voltage is within a first predetermined voltage range, and a first non-constant value when said output signal voltage is outside the first predetermined voltage range,
wherein the second output signal current has a second constant value when said output signal voltage is within a second predetermined voltage range, and a second non-constant value when said output signal voltage is outside the second predetermined voltage range,
the first and second node driver circuits further including:
first and second switching circuits each coupled to said signal node to configure the driver to alternately output said first and second constant value output signal currents and said first and second non-constant value output signal current in accordance with said output signal voltage, and
corresponding first and second transconductance circuits to provide said first and second output signal currents with said first and second non-constant values in accordance with said first and second input signal voltages; and
corresponding first and second current replication circuits coupled to said first and second switching circuits and to the first and second transconductance circuits, wherein the first and second current replication circuits, the corresponding first and second transconductance circuits, and the first and second switching circuits together operate as corresponding alternately active current source and sink circuits and provide said first and second output signal currents with said first and second constant values in accordance with said first and second input signals and said output signal voltage range.

4. An apparatus comprising:
an output node;
a first transistor having an output coupled to the output node, the first transistor having a control node and a first conduction path;
a current source circuit coupled to the control node of the first transistor;
a second transistor having a control node coupled to the control node of the first transistor and a conduction path coupled to the current source; and
a voltage controlled switching circuit coupled between the conduction path of the second transistor and the current source circuit, wherein when the voltage at the output node is within a first voltage range the switching circuit is in a conducting state, and the second transistor and the first transistor together form a current replication circuit, and when the voltage at the output node is within a second voltage range the switching circuit is in a non-conducting state and the first transistor is configured as a transconductance circuit, the voltage controlled switching circuit comprising a switching transistor, having a control node and a conduction path coupled between the second transistor conduction path and the current source circuit the control node of the switching transistor configured to receive a voltage indicative of the voltage at the output node to enable the switching transistor conduction path when the voltage at the output node is within a first voltage range, and to disable the switching transistor conduction path when the voltage at the output node is within a second voltage range.

5. The apparatus of claim 4, wherein the first transistor, the second transistor, and the switching transistor are PMOS transistors.

6. The apparatus of claim 4, wherein the first transistor, the second transistor, and the switching transistor are NMOS transistors.

7. The apparatus of claim 4, further comprising:
a first switch control current source;
a third transistor having a gate coupled to the output node and a conduction path coupled to the first switch control current source;
a second switch control current source and
a fourth transistor having a gate coupled to the first switch control current source and a conduction path coupled to both the second switch control current source and the control node of the switching transistor.

8. The apparatus of claim 7, wherein the third transistor is a PMOS transistor, and the fourth transistor is an NMOS transistor.

9. The apparatus of claim 7, wherein the third transistor is an NMOS transistor, and the fourth transistor is a PMOS transistor.

10. An apparatus comprising:
an output node;
a first transistor having an output coupled to the output node, the first transistor having a control node and a first conduction path;
a current source circuit coupled to the control node of the first transistor;
a second transistor having a control node coupled to the control node of the first transistor and a conduction path coupled to the current source;
a voltage controlled switching circuit coupled between the conduction path of the second transistor and the current source circuit, wherein when the voltage at the output node is within a first voltage range the switching circuit is in a conducting state, and the second transistor and the first transistor together form a current replication circuit, and when the voltage at the output node is within a second voltage range the switching circuit is in a non-conducting state and the first transistor is configured as a transconductance circuit; and
a first input transistor having a control node configured to receive a circuit input signal and a conduction path coupled in series between the current source and the control node of the first transistor.

11. An apparatus comprising:
an output node;
a first transistor having an output coupled to the output node, the first transistor having a control node and a first conduction path;
a current source circuit coupled to the control node of the first transistor;
a second transistor having a control node coupled to the control node of the first transistor and a conduction path coupled to the current source;
a voltage controlled switching circuit coupled between the conduction path of the second transistor and the current source circuit, wherein when the voltage at the output node is within a first voltage range the switching circuit is in a conducting state, and the second transistor and the first transistor together form a current replication circuit, and when the voltage at the output node is within a second voltage range the switching circuit is in a non-conducting state and the first transistor is configured as a transconductance circuit; and
an inverter circuit for receiving a circuit input signal, the circuit input signal having first and second digital states, wherein the inverter circuit couples the current source circuit to the control node of the first transistor when the circuit input signal is in the first digital state and the inverter provides a bias voltage to the control node of the first transistor when the circuit input signal is in the second digital state.

12. An apparatus comprising:
an output node;
a first transistor having an output coupled to the output node, the first transistor having a control node and a first conduction path;
a current source circuit coupled to the control node of the first transistor, the current source circuit sinking a digitally selectable current;
a second transistor having a control node coupled to the control node of the first transistor and a conduction path coupled to the current source; and
a voltage controlled switching circuit coupled between the conduction path of the second transistor and the current source circuit, wherein when the voltage at the output node is within a first voltage range the switching circuit is in a conducting state, and the second transistor and the first transistor together form a current replication circuit, and when the voltage at the output node is within a second voltage range the switching circuit is in a non-conducting state and the first transistor is configured as a transconductance circuit.

13. An apparatus comprising:
an output node;
a first transistor having an output coupled to the output node, the first transistor having a control node and a first conduction path;
a current source circuit coupled to the control node of the first transistor, the current source circuit sourcing a digitally selectable current;
a second transistor having a control node coupled to the control node of the first transistor and a conduction path coupled to the current source; and
a voltage controlled switching circuit coupled between the conduction path of the second transistor and the current source circuit, wherein when the voltage at the output node is within a first voltage range the switching circuit is in a conducting state, and the second transistor and the first transistor together form a current replication circuit, and when the voltage at the output node is within a second voltage range the switching circuit is in a non-conducting state and the first transistor is configured as a transconductance circuit.

14. An apparatus comprising:
an output node;
first and second transistors of complementary device types coupled to the output node, the first and second transistors each having a control node and a conduction path;
a current source circuit configured to respectively provide first and second reference currents to the control node of the first transistor and to the control node of the second transistor;
third and fourth transistors, the third transistor having a control node coupled to the control node of the first transistor and a conduction path configured to receive said first reference current, and the fourth transistor having a control node coupled to the control node of the second transistor and a conduction path configured to receive said second reference current; and
first and second voltage controlled switching circuits coupled to the conduction paths of the third and fourth transistors configured to receive the first and second reference currents respectively, wherein when the voltage at the output node is within a first voltage range the first switching circuit is in a conducting state and the second switching circuit is in a non-conducting state and the third transistor, together with the first transistor, form a current sourcing circuit, and when the voltage at the output node is within a second voltage range the second switching circuit is in a conducting state and the first switching is in non-conducting state and the fourth transistor, together with the second transistor, form a current sinking circuit.

15. The apparatus of claim 14, wherein
the first voltage controlled switching circuit comprises a PMOS transistor having a control node and a conduction path, the conduction path of the PMOS transistor being coupled to the conduction path of the third transistor and configured to receive the reference current, the second voltage controlled switching circuit comprises an NMOS transistor having a control node and conduction path, the conduction path of the NMOS transistor being coupled to the conduction path of the fourth transistor and configured to receive the reference current, and wherein the control node of the PMOS transistor and the control node of the NMOS transistor are configured to receive a voltage indicative of the voltage on the output node.

16. The apparatus of claim 14, further comprising a first input transistor having a control node configured to receive a high side circuit input signal and a second input transistor having a control node configured to receive a low side circuit input signal, the high side circuit input and the low side circuit input each having first and second digital states, the first input transistor having a conduction path coupled to receive the first reference current and configured to couple the first reference current to the control node of the first transistor when the high side circuit input is in the first digital state, and the second input transistor having a conduction path coupled to the second reference current and configured to couple the second reference current to the control node of the second transistor when the low side circuit input is in the first digital state.

17. The apparatus of claim 14, further comprising a first inverter circuit for receiving a high side signal and a second inverter circuit for receiving a low side signal, the high side signal and the low side signal each having first and second digital states, wherein the first inverter circuit couples the first reference current to the control node of the first transistor when the high side signal is in the first digital state and the first inverter circuit couples a first bias voltage to the control node of the first transistor when the high side signal is in the second digital state, and further wherein the second inverter circuit couples the second reference current to the control node of the second transistor when the low side signal is in the first digital state and the second inverter circuit couples a second bias voltage to the control node of the second transistor when the low side signal is in the second digital state.

18. The apparatus of claim 14, wherein the reference current is a digitally selectable current.

19. A method of driving an digital signal with a controlled slew rate comprising the steps of:

receiving a digital input signal on an input node;

detecting a transition of the digital input signal from a first digital state to a second digital state;

sensing a voltage on an output node:

generating an output current and coupling the output current to the output node, wherein, in accordance with the detecting and sensing, the output current has a constant value across a first output node voltage range and the output current has a non-constant value across a second output node voltage range;

generating a constant reference current and, in accordance with the detecting and sensing, replicating said constant reference current, wherein said output current is a multiple replication of the constant reference current when the voltage on the output node is within the first output node voltage range; and buffering the digital input signal and, in accordance with the detecting and sensing, coupling said constant reference current to said input node when the digital input is in a first digital state, and coupling said first control voltage to said input node when the digital input is in a second digital state.

20. A method of charging a capacitive node comprising the steps of:

sensing a first voltage indicative of a voltage on an output node;

mirroring a current from a current source into the output node when the first voltage is within a first voltage range;

deactivating a voltage controlled switch between a drain and a control node of a current mirror and driving current into the output node corresponding to a second voltage on the control node of the current mirror when the first voltage is within a second voltage range.

21. A method of discharging a capacitive node comprising the steps of:

sensing a first voltage indicative of a voltage on an output node;

mirroring a current from a current source out of the output node when the first voltage is within a first voltage range;

deactivating a voltage controlled switch between a drain and a control node of a current mirror and sinking current out of the output node corresponding to a second voltage on the control node of the current mirror when the first voltage is within a second voltage range.

22. An apparatus for providing an output signal with a controlled slew rate comprising:

a signal node having an associated node capacitance and configured to receive an output signal current and in accordance therewith convey an output signal voltage;

a node driver circuit coupled to the signal node and configured to receive said output signal voltage and an input signal and in accordance therewith provide said output signal current, the output signal current having a constant value when said output signal voltage is within a predetermined voltage range; and a non-constant value when said output signal voltage is outside of said predetermined voltage range, the node driver circuit further including:

a switching circuit connected directly to said signal node to configure the driver to output said constant value output signal current when the output signal voltage is within the predetermined voltage range, and to configure the driver to output said non-constant value output signal current when the output signal voltage is outside the predetermined voltage range, said switching circuit being configured to receive a control signal and in accordance therewith operate in one of a plurality of operational states which include an on state and an off state a transconductance circuit coupled to the switching circuit to provide said output signal current with said non-constant value in accordance with said input signal when said output signal voltage is outside of said predetermined range;

a current replication circuit connected to the switching circuit and to the transconductance circuit, wherein the current replication circuit, the transconductance circuit, and the switching circuit together operate as a current source circuit and provide said output signal current with said constant value in accordance with said input signal when said output signal voltage is within said predetermined voltage range; and a voltage sensing circuit, coupled to said switch circuit, configured to sense said output signal voltage and in accordance therewith provide said control signal.

* * * * *